United States Patent
Yount (10) Patent No.: US 8,729,904 B2
(45) Date of Patent: May 20, 2014

(54) METHOD AND SYSTEM FOR SAFE OPERATION OF LARGE LITHIUM-ION BATTERIES

(75) Inventor: Larry James Yount, Scottsdale, AZ (US)

(73) Assignee: Launchpoint Energy and Power LLC, Scottsdale, AZ (US)

(*) Notice: Subject to any disclaimer, the term of this patent is extended or adjusted under 35 U.S.C. 154(b) by 736 days.

(21) Appl. No.: 13/047,614

(22) Filed: Mar. 14, 2011

(65) Prior Publication Data

US 2011/0221446 A1 Sep. 15, 2011

Related U.S. Application Data

(60) Provisional application No. 61/314,123, filed on Mar. 15, 2010, provisional application No. 61/370,801, filed on Aug. 4, 2010.

(51) Int. Cl.
*G01N 27/416* (2006.01)

(52) U.S. Cl.
USPC ............ 324/434; 324/426; 324/427; 324/432

(58) Field of Classification Search
USPC .................................. 324/426, 427, 432, 434
See application file for complete search history.

(56) References Cited

U.S. PATENT DOCUMENTS

| | | | | |
|---|---|---|---|---|
| 8,046,180 | B2 * | 10/2011 | Huseth et al. ................... | 702/60 |
| 2003/0054230 | A1 | 3/2003 | Al-Hallaj et al. | |
| 2004/0155661 | A1 * | 8/2004 | Field et al. ...................... | 324/426 |
| 2006/0284617 | A1 * | 12/2006 | Kozlowski et al. ............ | 324/426 |
| 2009/0295397 | A1 * | 12/2009 | Barsukov ....................... | 324/429 |

FOREIGN PATENT DOCUMENTS

WO   WO2006082425 A1   8/2006

OTHER PUBLICATIONS

Kim, Gi-Heon; Pesaran, Ahmad; "Analysis of Heat Dissipation in Li-Ion Cells & Modules for Modeling of Thermal Runaway"; journal article; May 15, 2007; 29 pages; The 3rd International Symposium on Large Lithium Ion Battery Technology and Application.

Johnson, Barry W.; "Design and Analysis of Fault-Tolerant Digital Systems", journal article; 1989; 35 pages; Addison-Wesley Publishing Company, Reading, Massachusetts.

Sen, Chitradeep; Kar, Narayan C.; "Battery Pack Modeling for the Analysis of Battery Management System of a Hybrid Electric Vehicle"; journal article; Sep. 7-10, 2009; 6 pages; Vehicle Power and Propulsion Conference, 2009. VPPC '09. IEEE.

* cited by examiner

*Primary Examiner* — Drew A Dunn
*Assistant Examiner* — Nathaniel Pelton
(74) *Attorney, Agent, or Firm* — George P. White (57) ABSTRACT

Modeling and testing are used to characterize consequences of a first lithium-ion cell having an internal short. The vulnerability of a second lithium-ion cell being induced into thermal runaway by the energy released by the first cell undergoing an internal short is quantified. Characteristics of the packaging of Li-ion cells within a battery pack are analyzed. Combined, these analyses determine the robustness required of a cell in order to withstand a nearby cell's internal short given that the battery is maintained within the specified operational envelope by a BMS and this envelope is modified in real-time as required to meet the safety requirement. Robustness factors are: age, history of charging/discharging, as well as immediate state of charge and environment. In operation, the cell's operational history is incorporated into a model. When the model indicates cell robustness at a predetermined lower limit, operation of the cell is ceased or limited.

12 Claims, 9 Drawing Sheets

METHOD AND SYSTEM FOR SAFE OPERATION OF LARGE LITHIUM-ION BATTERIES

RELATED APPLICATIONS

This application claims priority from U.S. provisional application 61/314,123, filed on Mar. 15, 2010 and U.S. provisional application 61/370,801, filed Aug. 4, 2010, which are hereby incorporated herein by reference in their entireties.

FIELD

This is related to the design of large lithium-ion batteries and methods of their safe operation. It is particularly related to modeling varying cell robustness and using active battery management to enhance battery safety.

BACKGROUND

Lithium-ion cells have a high energy density that has contributed to their use in laptop computers and other portable electronic devices. Electric vehicles (EVs), both hybrid and purely electric are starting to use these cells. One disadvantage of lithium-ion cells is the potential for a destructive thermo-chemical reaction. There have been widely reported incidents involving laptop computers and their battery packs getting dangerously hot. A laptop only uses a handful of cells whereas an EV pack might contain more than one hundred cells, multiplying the danger.

Extreme damage to property and life may be caused if a chain reaction of runaway energy-releasing events occurs. A chain reaction could start with one failed cell's destructive condition causing another nearby cell to also have a significant energy release, propagating the failure and so on, engulfing over one hundred cells in an EV. Attempts at solutions have focused on either improving the inherent characteristics of Li-ion cells or on improvements in mechanical packaging of the many cells making up a battery.

There is a need to reduce the probability of a battery-wide destructive chain reaction without counting on close to perfect cells and while keeping cost, weight, power density needs, and other practical factors in mind.

SUMMARY

The teachings herein include acknowledging that various manufacturing defects and variability might cause an individual cell to spontaneously suffer an internal fault (e.g., internal short) notwithstanding the care with which it is designed and tested, and notwithstanding how it is charged, discharged and housed.

Embodiments can mitigate the danger of one cell's worst-case event inducing neighboring cells into also having a significant energy release. Implementation of these teachings can model robustness as a factor of a cell's type and current state in real time. Factors that can be included in cell robustness are: state-of-charge, internal temperature, age, and history of overcharge episodes. In addition, history of overdischarge episodes, history of ambient temperature excursions, and rates of charging and discharging can be factored in the model. Immediate history, medium term history, and more long-term history can be used in various embodiments. Embodiments can produce a dynamic, real-time model of each cell's vulnerability to the worst-case event of its neighboring cells, given the battery's mechanical packaging.

Implementations of a model can be constructed in hardware, software, firmware, or a combination of these. In some embodiments, a model's results can detect that a particular cell in a particular location is nearing a preset limit of vulnerability to a worst-case event occurring in a nearby cell. Actions taken in that case might include real-time decisions to pause or limit operations to keep cells within a "robustness envelope". That envelope could be predetermined from the modeling, analysis, and testing to be consistent with an acceptably low probability that the each given cell would suffer its own destructive failure as a consequence of the worst-case event of one of its proximate fellow cells.

Methods, systems, subsystems, and components can embody these teachings. Methods include both those performed at the time of design and at the time of operation.

DETAILED DESCRIPTION

Introduction

It is desirable to minimize total battery volume by packing cells tightly together. For a given cell type that would result in a higher, energy density battery. However, lithium-ion cells can have an internal fault that causes the release of a significant quantity of energy. A worst-case internal fault might be an anode-to-cathode short. In that case all the energy stored in that cell would be rapidly and destructively released.

The energy released from one cell undergoing this type of event could cause a physical breakdown of a neighboring cell. That neighboring cell might then have a large energy-releasing failure as well. This is a recipe for a battery-wide thermal runaway chain reaction. In an EV battery pack with over 100 cells, the total energy release could be life threatening as well as difficult to extinguish. One way to address this problem might be to arrange the cells at some distance from each other and with as much of a barrier between them as practical. Of course that would negatively affect energy density and costs.

Others have addressed this problem with research towards cells with a greater mean-time-between-failure (MTBF) and corresponding lower probability of a destructive failure over a given time interval. In critical applications, that cell failure probability value may not confidently be low enough to solely rely upon. Therefore, it is desirable to separately provide for a second, independently determinable factor regarding a single-cell destructive event not propagating to nearby cells in a chain-reaction fashion.

Figure 1:
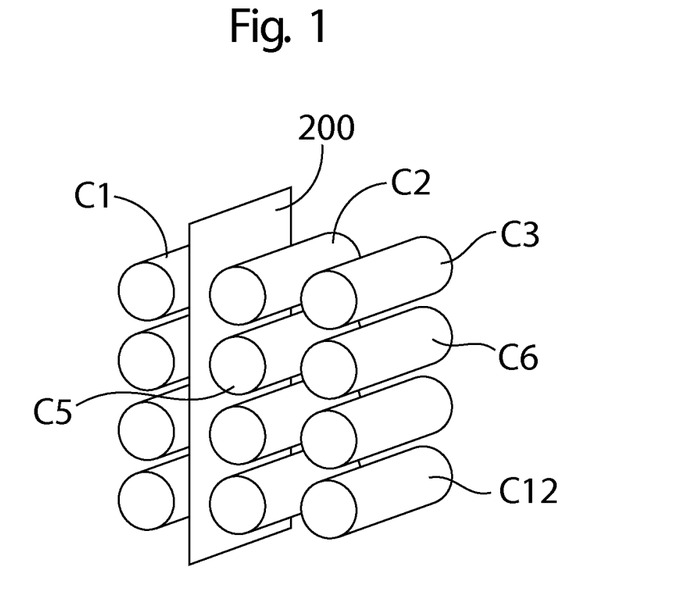
FIG. 1 shows an example 12-cell battery configuration.

FIG. 1 shows a simplified example of twelve cells arranged as a battery. For this example they are in a 3×4 array with a larger cell-to-cell spacing horizontally rather than vertically. An energy absorbing and deflecting separation barrier 200 is placed between the column of cells C1, C4, and C7 and the column of C2, C5, and C8. (Cells are numbered left to right and top to bottom although just a few are actually labeled). Developing a value to represent the probability that a worst-case event will propagate in this configuration can be done by the following steps.

Figure 2:
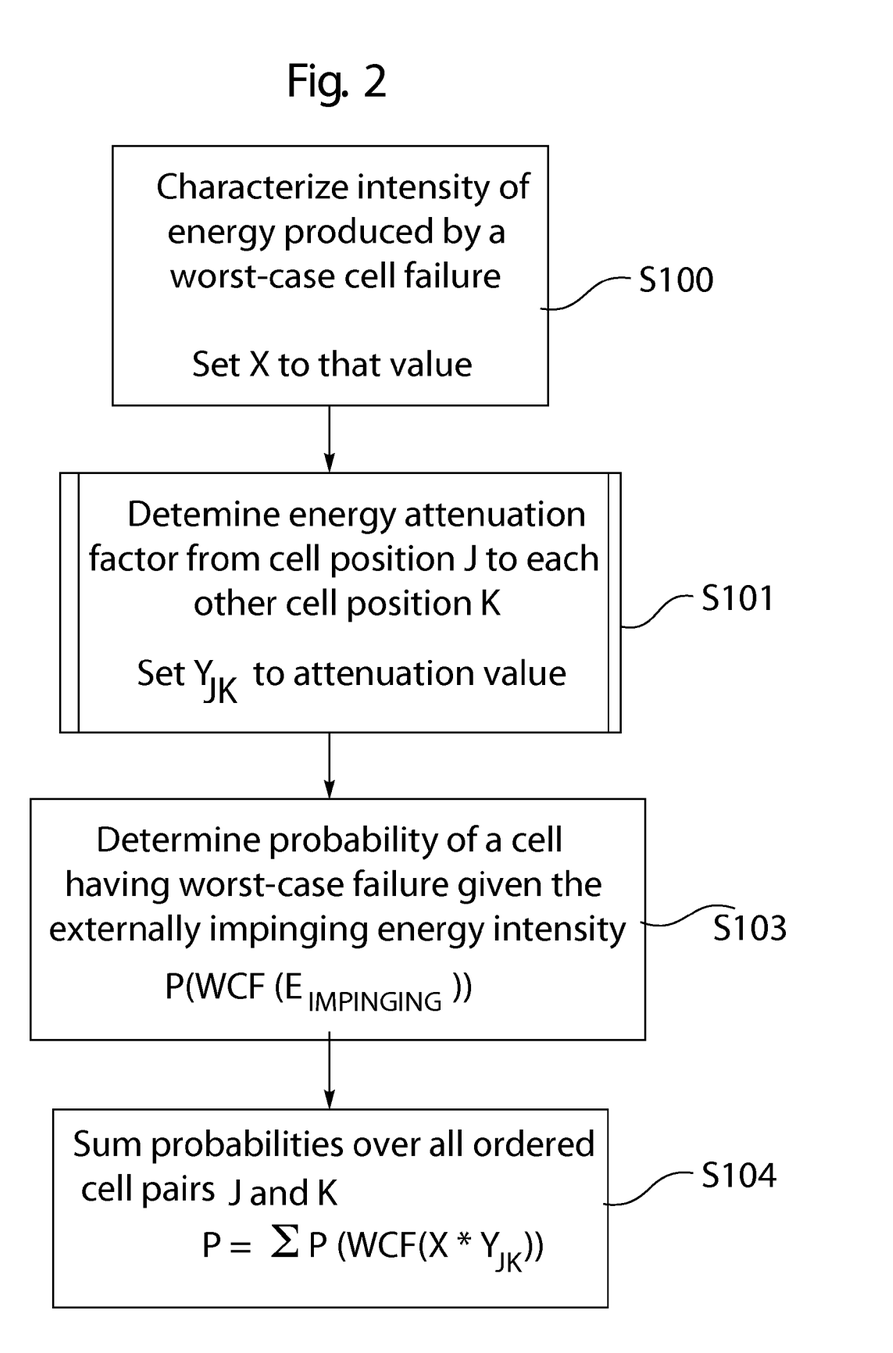
FIG. 2 is a flowchart for determining probability of fault propagation in a battery system, given an initial failure.

Diagramed in FIG. 2 are steps involved in determining the probability that an initial failure in a battery system will lead to a chain reaction of energy release. One step is to characterize, in a quantitative manner, the degree, and pattern of the destructive energy (X) of a worst-case single-cell event S100; then, for each relevant ordered cell pair $C_j$, $C_k$, determine an energy attenuation factor (Y) 105 attributable to the mechanical configuration S101

Figure 3:
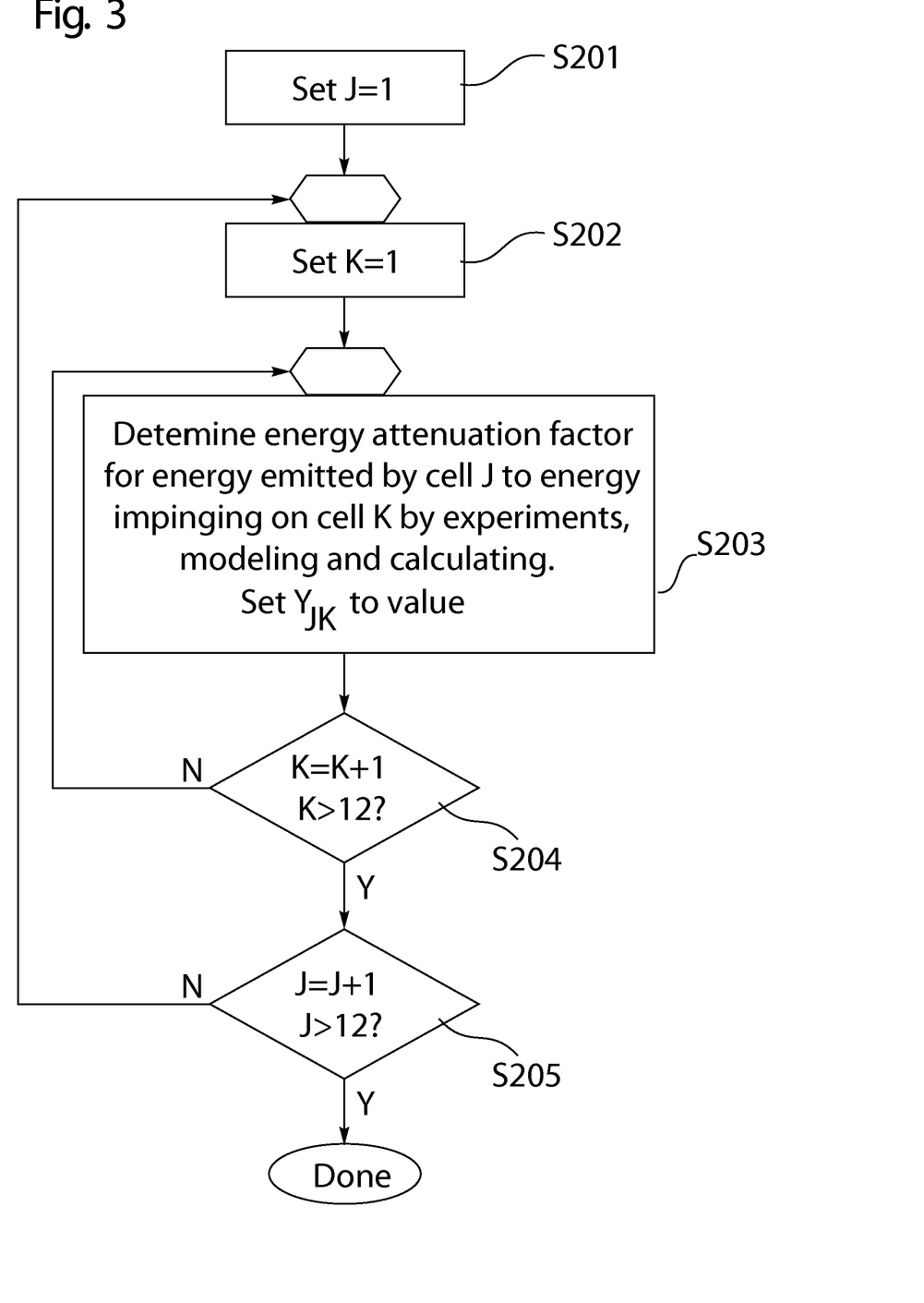
FIG. 3 is a flowchart with detail on determining energy transfer values.

FIG. 3 breaks this step S101 down into a process of sub-steps S201 S202 S203 S204 S205 to determine and assign attenuation factors to each ordered pair of the 12 cells. The attenuation factor (Y) of energy originating at cell $C_J$ that reaches cell $C_K$ would be $Y_{jk}$. Referring to FIG. 1, a higher percentage of the energy emitted by cell C1 might reach cell C4 than would reach cell C2 due to the separation barrier 200, for example.

As seen in FIG. 2 another step is determining the probability that a given amount of impinging energy will push a cell S103 to an unacceptable level of energy release. It is known to those skilled in the art that multi-physics modeling, experiments, and calculations can determine this. Although this probability function will be dependent upon aspects of the state of the "innocent" cell at the time it is subjected to an extreme energy release, at this point in the description that is neglected.

Figure 5:
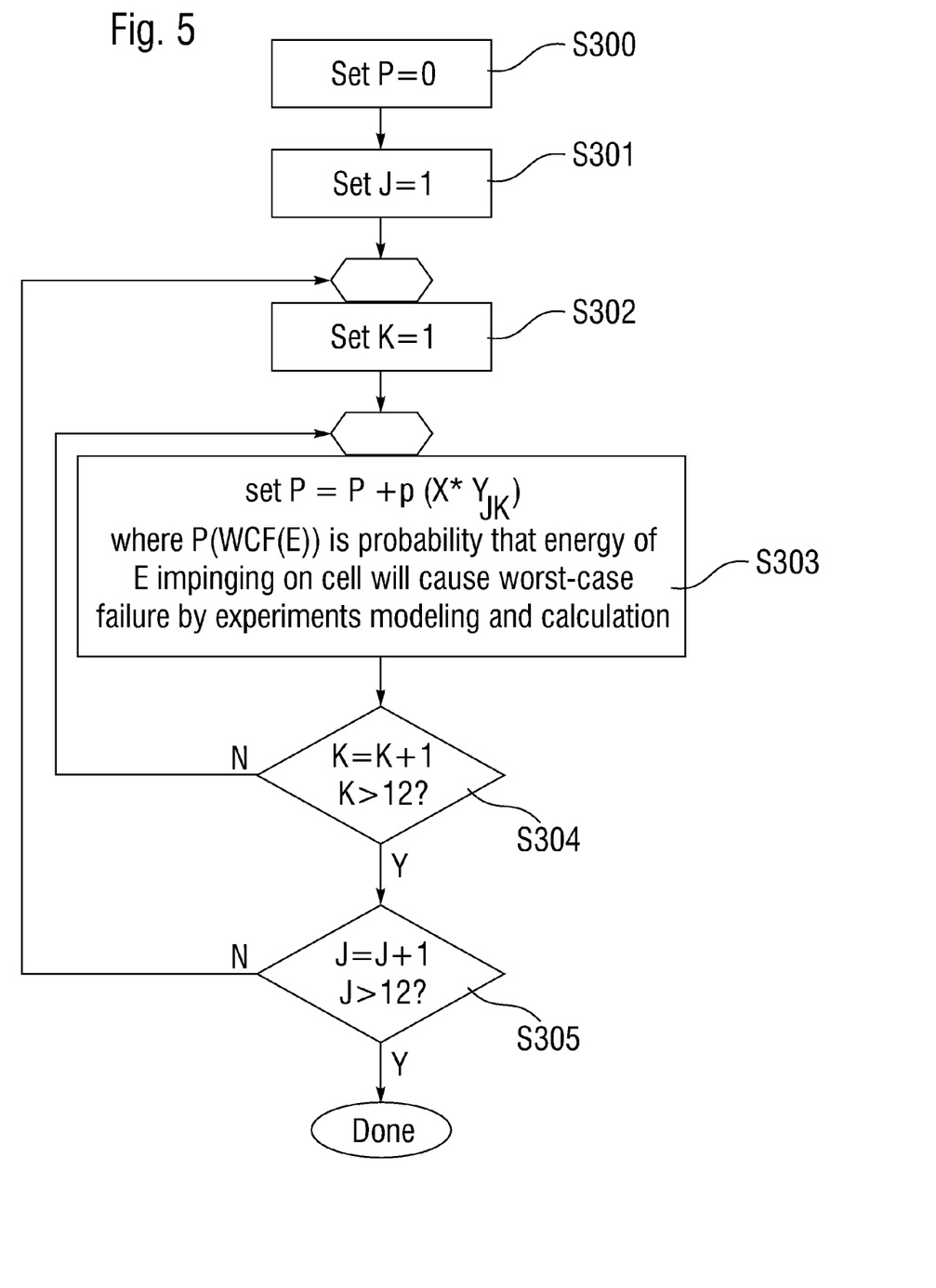
FIG. 5 is a flowchart showing propagation probability calculation.

Applying the energy values and probability functions determined above, another step is to calculate and sum the probabilities of each $X*Y_{JK}$ of energy, $Y_{JK}$ determined over the ordered pairs $C_J$, $C_K$, leading to an unacceptable failure. This is shown in sub-steps S300 S301 S302 S303 S304 S305 in FIG. 5. The result would be compared to a desired (low) probability.

As mentioned above, the actual probability of a cell having a Significant Energy-Releasing Failure (SERF) upon a given amount of energy imposed on it (its vulnerability) will actually be a function of the overall state of that cell. Many factors including internal temperature, state of charge, and operating history contribute to the cell's state of vulnerability. Initially, probability function $Pr(SERF(E_{impinging}))$ determined for a cell in a weakened state. The method above should be carried out using a probability function for a cell in the most vulnerable state a cell may be in over the life of the battery. An aged cell that has a full charge, a high internal temperature, a history of over-discharging, and is presently undergoing a rapid discharge might represent this lowest state of cell robustness, for example. In the last step of FIG. 2, the probabilities are summed over all of the ordered pairs of cells in the battery S104.

In contrast, embodiments discussed herein are based on an understanding that cell robustness is inherently dynamically changing during usage (e.g., charging, discharging, and ambient conditions). Both short term and long term events influence the immediate state of robustness. Robustness can be modeled and tracked on a cell-by-cell basis over the system's life.

The methods and systems taught herein include those with real-time models of each cell's dynamically changing robustness. This allows for a battery design based on reduced constraints on the Y (mechanical attenuation of energy transfer) since the robustness state is dynamically calculated and tracked rather than having to be statically assumed to be at worst-case when the system is being designed. Essentially the probability functions can be dynamically evaluated while operating, based on updated robustness state of each cell from a run-time model. This allows the packaging to be designed for a typical robustness rather than a worst-case robustness. A battery management system then dynamically assures that the desired safety equation always holds. Those skilled in the art will recognize that the various factors of energy release, attenuation, and vulnerability are preferably modeled as multi-dimensional factors rather than scalar factors.

Simplified Example

Simplified Example Calculation—To further explain the principles of this teaching, a hypothetical two-cell system is presented. The following analysis makes many simplifying assumptions to facilitate its illustration.

Configuration

Figure 4A:
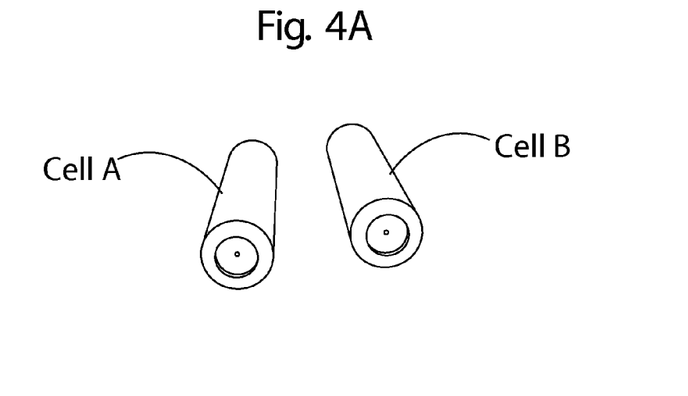
FIG. 4A is an example two-cell system.

Two cells of the 18650 form-factor (cylinder of r=9 mm, height=62 mm, mass=45 grams) parallel to each other in free space at a given distance, D as seen in FIG. 4A. The cells (cell A and cell B) each have a maximum charge of 1100 mAh. The scenario starts with cell A undergoing a rapid release of its energy that impinges on cell B. This analysis demonstrates a method of assigning a probability to cell B being induced into a state of rapid release of its energy as well; i.e., probability of propagation of the fault.

In the notation previously presented, X is the worst-case energy released from cell A's catastrophic failure, Y is the % of that energy that reaches cell B, and Z is the amount of energy that, if absorbed by cell B at a given point in time, will have a 50% probability of inducing it to release sufficient energy to enter a thermal runaway.

Energy Release

Figure 4B:
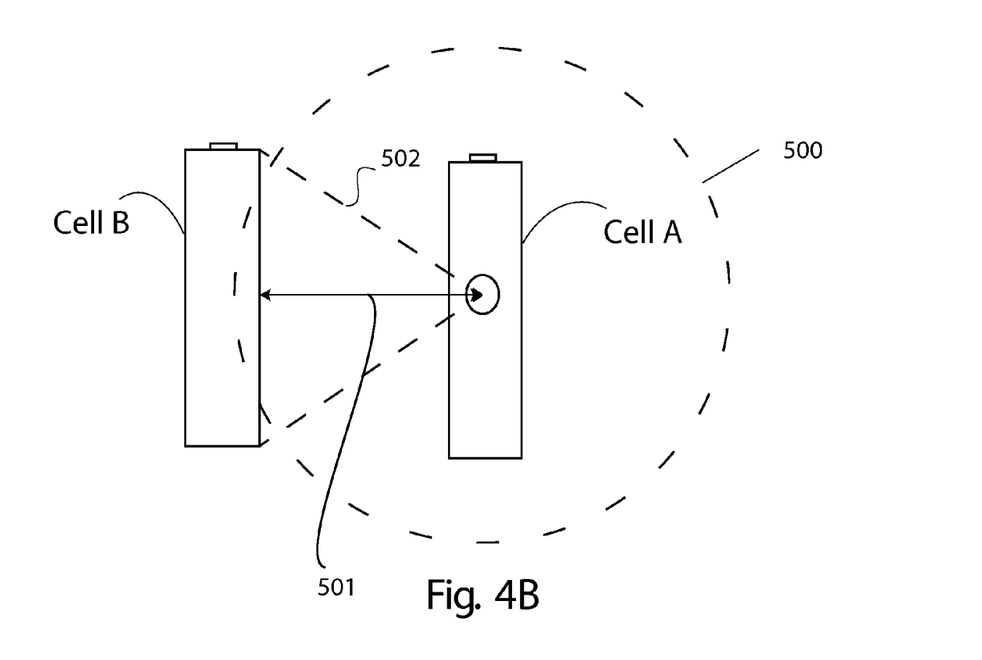
FIG. 4B is a two-dimensional representation of energy emitted from the first cell impinging on the second cell.

At 3.6 volts and 1100 milliamp-hour of charge, the maximum energy held within cell A would be 3.7 V×1100 mA or about 4 watt-hours (1460 joules). This is taken as X, the total energy releasable by cell A. In this simple example, energy is assumed to be released as heat radiating uniformly, radially, from a point at the center of cell A. FIG. 4B shows a simplified two-dimensional profile of cell A emitting energy 500 from a central point, a portion of which 502 impinges on cell B. The percent of the total released energy of cell A that impinges on cell B in free-space is calculated geometrically based on the distance between the cells 501.

Attenuation/Transfer Function

Since there is no attenuating structure in this example, the physical relationship of the two cells dictates the percent of the total released energy that can impinge on cell B. Geometry determines the percent of the sphere that the solid angle from the center of cell A to the surface of cell B represents. It can be approximated as the area of the cross-section of the cylinder of cell B divided by the total surface area of the sphere representing the radiating energy at the point it reaches cell B. That would be $(62*18)/(4*Pi*D*2)$. At a distance of 140 mm, that is 0.45%. An additional factor in the transfer function is that cell B does not absorb and retain all the radiated energy that impinges upon it. Much will be reflected or re-radiated. For this example 30% energy absorption is assumed. Together with the solid angle factor, the transfer function of total energy released to energy absorbed is then 0.45%*30%=0.014%.

Tolerated Absorbed Energy

The final, and central value, is cell B's robustness at a given state, expressed as the energy cell B would absorb to have a 50% probability of going into thermal runaway. That is dependent on the first order effects of state of charge and internal temperature profile. In this example, that probability is assumed to be reached at an internal temperature of 150 C for a new cell. Research has shown that aspects of the operating history of a cell can leave a lasting effect on a cell's chemical stability. For example, one paper demonstrated that multiple cycles of over discharging reduces the temperature required to be at the 50% probability of a thermal runaway propagation. One way to model this is linearly, with each over discharge affecting the 50% probability temperature point by a fixed amount. If each over discharge reduced this point by 0.1 C, then 300 over-discharges would increase a cell's vulnerability by reducing the 50% point to 120 C.

To translate an energy absorption value into internal temperature rise requires a consideration of the object's specific heat capacity and its mass. If the 45 gram cell is presumed to have a "lumped" specific heat of 1 J/gK, one joule would raise the cell's temperature by (1000/45)*1 or 22 degrees C. Looking at it the other way, $\frac{1}{22}$ of a joule (0.045 j) will raise the temperature by 1 degree.

Using the X of 1440 joules and the Y of 0.14, cell B absorbs 1.96 joules, which raises its temperature by 1.96/0.045=43.5 degrees. If the immediate past activity of the cell has the internal temperature at 100, then the 43 rise brings it to 143, well past the 130 degree 50/50 point if it suffered 200 over-discharges.

Example at 250 mm Spacing

If the batteries were moved to 250 mm spacing the same analysis as above produces a temperature rise of 13.6 C. At an initial temperature of 100 C, the 13-degree rise would be below the 130-degree 50/50 point.

Dynamic Control of Vulnerability

Instead of adding 110 mm between the two cells to cover the case of 100 C internal temperature with 200 over-discharges, cell B could be prevented from being in that state of reduced robustness. If normal operation of cell B were ceased if its internal temperature reached a pre-designated value, dynamically de-rated by 0.1 C for every over-discharge (using the previous simple assumption) then the cells could remain at 100 mm spacing. One predetermined rule that a BMS for this system might enforce is: go into a restrictive operating mode if either cell has over 50 over-discharges, if that is what the desired safety and probability models suggest. Actual embodiments would preferably use research results and validated physics based models.

Example Method of Designing

Figure 7:
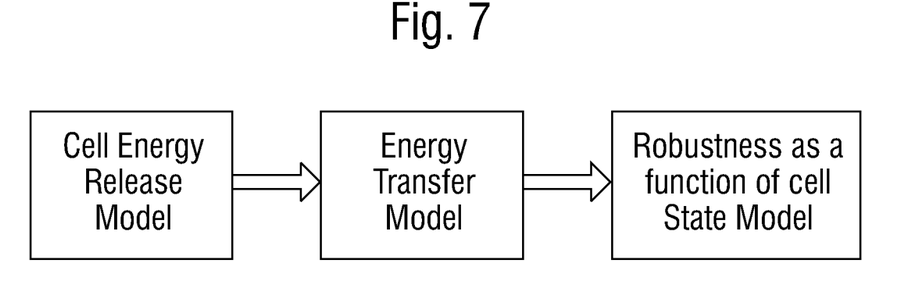
FIG. 7 is a diagram of the design process.

Referring back to FIG. 1, the cells in that example are packaged with an energy absorbing and deflecting separation barrier 200 inserted within the battery. Purely as an example, this helps illustrate that the cell-to-cell energy transfer function is not a constant. To model this battery, three physical analyses are performed during design of the BMS and physical battery pack. FIG. 7 shows the actions taken in the design process.

Methods of Designing and of Operating a Battery Pack

This method produces a probabilistic rating of a given battery pack's likelihood to have a pack-wide extreme release of energy caused by a single cell's worst-case energy releasing event propagating to the other cells of the battery in a chain reaction. It can also produce operation-time parameters and rules. These parameters and rules can be used in the monitoring and controlling of the battery pack's operation to maintain the system below a predetermined probability of such a chain reaction occurring.

The possibility of a cell having a worst-case release of energy on its own is taken as a given by this method. The event of concern is the transference of energy from a "worst-case-faulted-cell" to one or more "proximate-cells". It is desirable to design and continually operate a battery pack such that the probability of destructive propagation to a proximate cell is sufficiently low as to be within the bounds indicated by a system-wide safety analysis. The following will refer to elements in FIG. 6.

Design Time Method

Step 1

Figure 6:
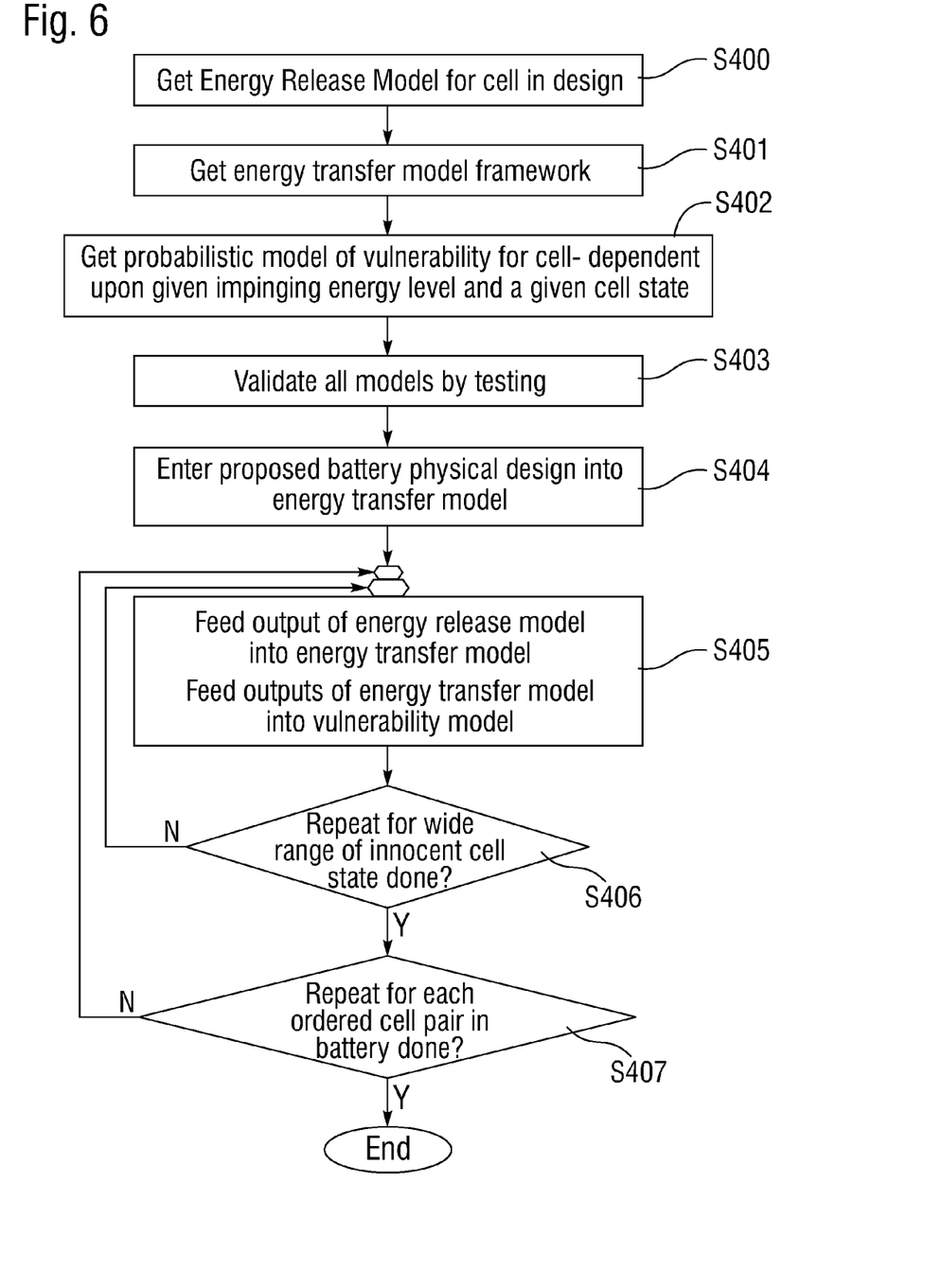
FIG. 6 is a flowchart of the design process.

Acquire or develop a model of the worst-case spontaneous release of heat for a cell type used in the battery S400. This is preferably a research and multi-physics based model that covers the heat potentially generated, conducted, convected, and radiated in three-dimensions. The developed model produces a profile of energy release under a worst-case event.

Step 2

Acquire, or develop a physics-based model of the battery as a whole that projects energy released from a given cell position as it is transferred into energy impinging on another cell of the battery S401. This is an energy translation model. For each cell to each other cell in the battery there is a unique attenuation or transfer function that would apply to energy by a cell in position n to the cell in position m. This modeling would be primarily mechanical/physical rather than chemical and those skilled in the art will be familiar with the techniques involved. The result of this model could be a set of attenuation factors for energy transfer between cell positions.

Step 3

Acquire or develop a second model of the cell type used in the battery S402. That model being such that it allows prediction of the probability that a given level and character of energy impinging on a cell of a known state, will push that cell into its own worst-case event. This is a robustness model. The model's inputs preferably include: (a) degree, kind, direction, and duration of energy being externally imposed upon the cell; (b) initial internal temperature of the proximate cell; (c) initial ambient temperature; (d) cell past history; and (e) other cell state factors. Cell state factors include recent cell charge/discharge/usage and the state-of-charge.

Using the same modeling software and techniques, a particular Li-ion cell design is analyzed and simulated to characterize its vulnerability to be breached in a manner that leads into an externally induced rapid release of energy. Rather than producing a fixed result as in the model of step 1, this design stage produces a model in which vulnerability probability varies with the age and usage history of the modeled cell. Usage history factors include charging history, discharging history, and environmental history, particularly temperatures. Usage history can cover various timeframes in alternate embodiments consistent with these teachings. Modeling can be done by physical modeling, statistical modeling, non-linear modeling, linear modeling, and otherwise. Also, the robustness model preferably produces a probabilistic result.

An electrochemistry-based model provides information on the limiting factors. Internal short-circuit is a multi-physics, 3-dimensional problem related to the electrochemical, electro-thermal, and thermal abuse reaction. An example of modeling software is COMSOL Multi-physics.

Step 4

Preferably, these three models are validated by testing S403. If indicated, information from testing is fed back into the analysis and the model is modified.

Laboratory Testing (Model Validation)

Testing can include heat transfer within the battery including measurement of heat transfer effects (a) from the faulted cell boundary, (b) across the battery to the boundary of proximate cells, and (c) as a function of contributing factors. For this experimentation, the heat is artificially introduced into the battery enclosure to represent heat generation by a faulted cell. Accordingly, the heat transfer coefficients (see equation below) can be determined.

$$h = \frac{\Delta Q}{A \cdot \Delta T \cdot \Delta t}$$

where
$\Delta Q$=heat input or heat lost, J
h=heat transfer coefficient, W/(m²K)
A=heat transfer surface area, m²
$\Delta T$=difference in temperature between the solid surface and surrounding fluid area, K
$\Delta t$=time period, s Other modeled effects to be validated by experiment include heat attenuating physical structures and materials evaluated as to their effectiveness in mitigating heat transfer. Heat absorption properties, more effective at high temperature may require higher temperature testing. Worst-case directional effects such as 'venting' should be considered, including directional venting.

Measurement of heat propagation effects internal to the proximate cell(s) can include both artificially induced heating and induced cell failure. Measurement of heat affects both at the proximate cell physical boundary and internal to the cell is recommended. Cell fault inducements and measurements are desirable to validate the models of cell worst-case heat production characteristics, peak magnitude, time-profile and directionality. Additional analysis may be necessary to most accurately validate the models, with physical cell fault inducement as the starting point in this determination.

Result: Laboratory testing can lead to validated models, which can then be used to determine the probabilistic relationship of cell failure to fault propagation for proximate cells.

Step 5

A specific battery mechanical configuration is loaded into the model of step 2 S404. Then the models are collectively used to determine the probability of propagation of a single cell's worst-case event to another cell. The output of the energy release model of step 1 is fed as the input to the energy translation model of step 3. Those outputs are, in turn, fed into the robustness model of step 3 over a broad range of circumstances and cell states S405. Together, this will output the probability of fault propagation.

Step 6

Repeat Step 5 for each cell in the pack S406.

Step 7

If the probability of propagation is unacceptably high for the intended application assuming the battery cells are a typical state, the battery is redesigned S406. Distance, insulating material, or absorbing material might be added between the cell positions. Also, provisions for dynamic cooling or alternate selection of cell chemistry and cell construction may be employed to improve the robustness of the battery.

The model can then be re-run until a desired probability profile is achieved and be repeated for each ordered cell pair in the battery S407.

Battery Cell Variations

Lithium-ion cells are not uniform in their design, size, chemistry, and construction. There are many form factors including a popular cylindrical design called the "18650" cell. Although this is somewhat of a standard in energy, voltage, mass, and diameter there are a variety of versions even of this "standard" cell with differing details in the chemistry, cathode and anode configurations, and manufacturing processes. Each cell version will have distinct characteristics in energy stored, pattern of energy release upon a fault, and of vulnerability to a nearby energy release of another cell in the battery.

Operating Time Method

Figure 8:
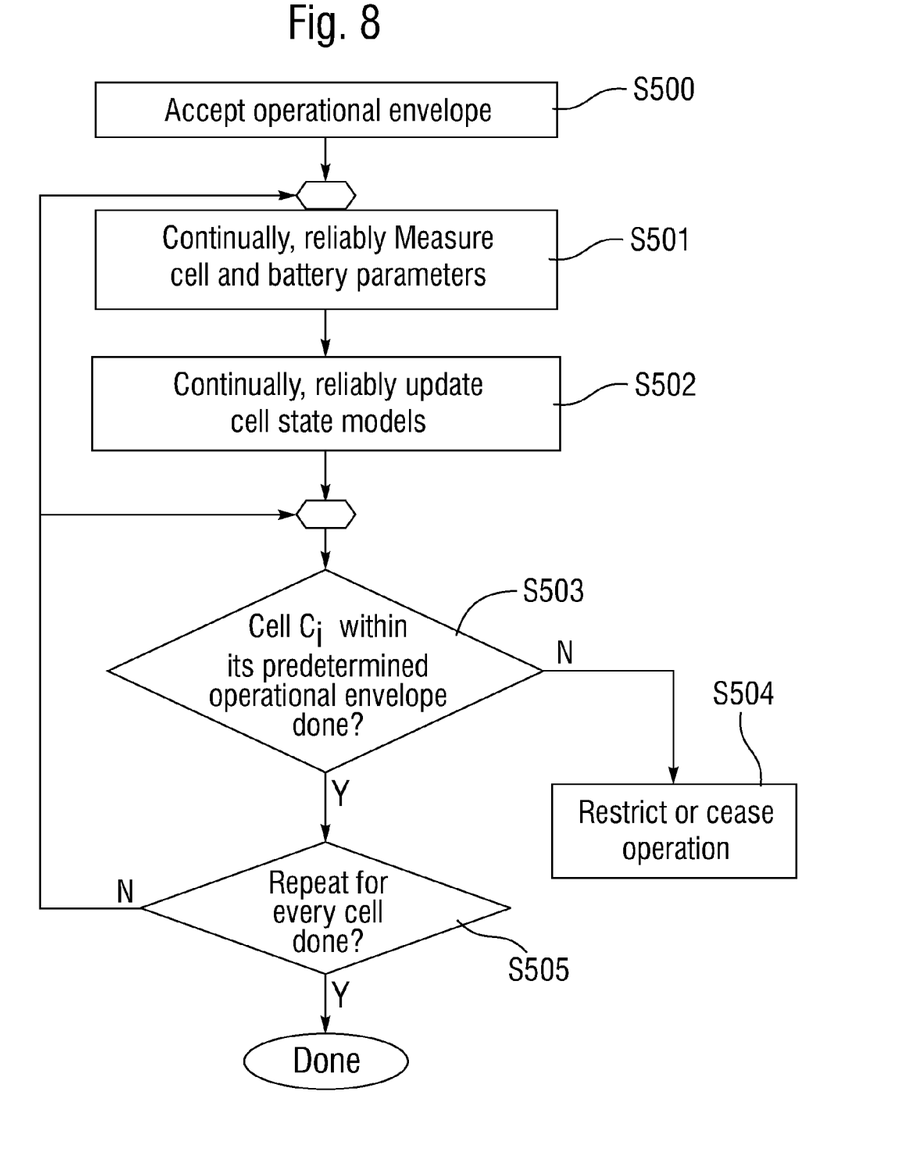
FIG. 8 is a flowchart of the run-time process.

For a battery design that does provide an acceptably low probability of propagation over a typical range of cell states but an unacceptable probability in outlier or corner cases, an operating-time method can be employed to dynamically control the probability of a chain reaction. From the models and method above, determine an envelope of cell initial states for each cell in the battery such that, within that envelope, the running of the models above, produce an acceptably low probability of propagation. As seen in the flowchart of FIG. 8, first the BMS is configured with a specific robustness envelope model or rules S500.

Step 1

During operation, for each cell, track the variables that factored into the vulnerability model S501.

Step 2

Use the tracked parameters to evaluate and update cell state S502.

Step 3

Check for any cell's state approaching its predetermined envelope S503.

Step 4

Modify, or restrict operation to keep that cell's state within its predetermined envelope S504. The operation-time model is preferably simplified in comparison with the design-time models mentioned above. Restricting operation can include limiting total charge and limiting the rate of charging and discharging. Other actions can include reconfiguring the battery electrically to take one or more cells out of the circuit. Combining the dynamic vulnerability model with the two more static profiles of worst-case energy release and cell-to-cell energy transfer can produce a real-time model. This model can be in the form of a lookup table, linear model, non-linear model, neural net, or other implementation. The logic of the BMS system enforces an allowed range of operation in a multi-dimensional space.

Explanation of Probability Equations

This propagation probability can be included in the safety calculations in addition to the cell random fault probability validating that the battery satisfies safety requirements through formal safety analysis.

$$\lambda_{system} = \left( \sum_{j=1}^{N} \sum_{i=1}^{N} P_{(j \to i)} \right) \times \lambda_{cellfault} \times N$$

Where P(j→i) is the probability that a release of cell j's stored energy will lead to a destructive propagation to cell i. Dynamically, this would be at cell j's present energy storage level and cell i's present vulnerability state.

Battery Operation

While in operation, the BMS implements the necessary controls or limits on operation as required to maintain the state of the cells to within a specified "operational envelope". Dynamic controls that might be exercised by the BMS include the following:

Restriction of Cell charging/Discharging activity/rate;
Cooling to reduce ambient temperature;
Restricting maximum SOC;
Restricting minimum SOC.

System and Device

Figure 9:
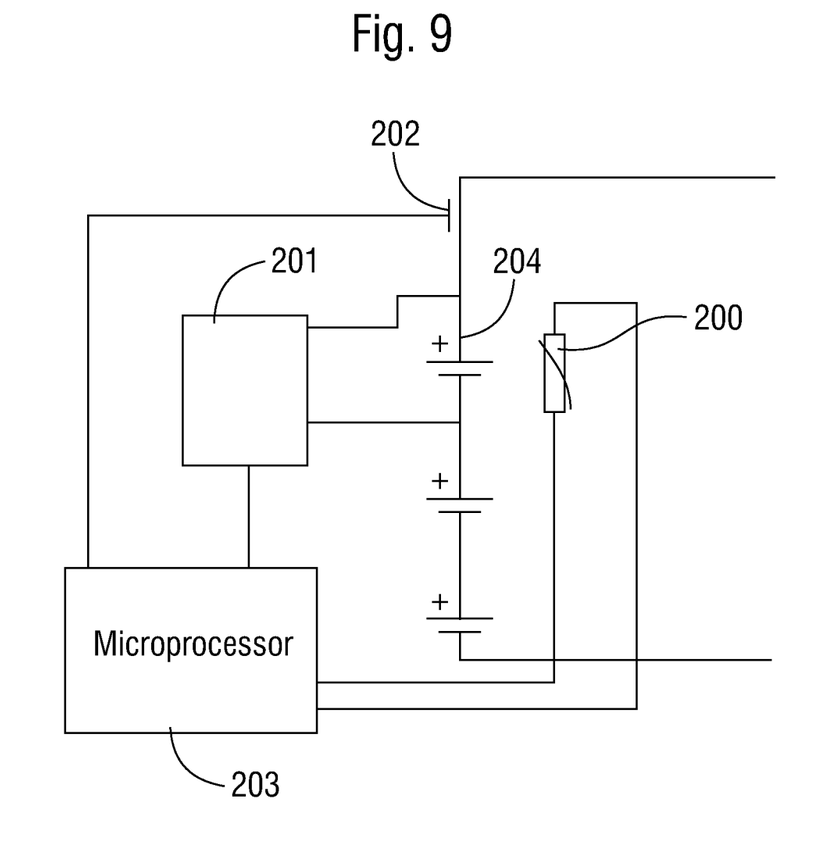
FIG. 9 shows a schematic of a simplified example system.

An example battery management system implementing these teachings is shown in FIG. 9. While BMS implementations have a primary task of controlling charging, discharging and cell balancing, this discussion focuses only on this unique BMS function of robustness modeling. Sensors for temperature 200, voltage 201, and current 202 allow the microprocessor 203 to measure quantities relevant to cell 204 degradation over time and events.

If the model shows that any particular cell is approaching a preset vulnerability level to its unique "threat" the microprocessor can reduce the hazard situation by a variety of responses. They could range from an indicator light, to pausing operation, to limiting operation in a manner that "brings the cell back from the edge." One possibility would be to use relays to remove a cell or string of cells from use and to fully discharge them.

Those skilled in the art will be familiar with the modeling and analysis required to make and use embodiments related to these teachings. Various embodiments with various modifications as are suited to the particular use contemplated are expected. In the following claims, the words "a" and "an" should be taken to mean "at least one" in all cases, even if the wording "at least one" appears in one or more claims explicitly. The scope of the invention is set out in the claims below.

The invention claimed is:

1. A method of producing a safety model for a battery management system for a battery pack comprising the actions of:
   a) analyzing a first cell version to determine values of parameters characterizing its release of energy under a substantially worst-case destructive internal cell malfunction;
   b) analyzing a second cell version to determine its vulnerability to damage from externally impinging energy; said analysis such as to characterize the second cell version's degree of vulnerability to be induced into an energy releasing condition as a function of factors comprising its internal state;
   c) modeling to determine the intensity of the energy that impinges on a cell of the second version, that second version cell being in an energy receiving cell location within a given battery pack design; the energy resulting from an internal failure of a cell of the first version at an energy releasing cell location in the battery pack;
   d) determining the probability of the cell in the energy receiving cell location being induced into an energy-releasing failure by energy released from the releasing cell position; such determining accomplished by applying the values determined in the above action (a) into the analyzing of action (b) and then applying those results into the model of action (c)
   wherein the actions of analyzing and modeling and determining are at least partially accomplished by calculations performed by a computer system having a processor and memory.

2. The method of claim 1 wherein at least one of the cell versions of the first and the second cell version are lithium-ion cells.

3. The method of claim 1 wherein the actions of analyzing and modeling and determining are at least partially accomplished by using experimental data to validate models.

4. The method of claim 1 wherein a cell's internal state comprises its charging and discharging history.

5. The method of claim 1 repeated for substantially every cell location populated by a cell of the second version as the energy receiving location.

6. The method of claim 1 repeated for substantially every location populated by a cell of the first version as an energy releasing location.

7. The method of claim 1 wherein said actions of modeling and of determining are repeated for a plurality of cells in a battery pack design.

8. The method of claim 1 wherein a cell's internal state includes a modeled state-of-charge.

9. The method of claim 1 wherein a cell's internal state includes a modeled internal temperature.

10. The method of claim 9 wherein a modeled internal temperature comprises a three-dimensional temperature profile.

11. The method of claim 1 wherein the first cell version and the second cell version are distinct cell versions.

12. The method of claim 1 further comprising age as a factor in modeling the second cell version's degree of vulnerability to be induced into an energy-releasing failure.

* * * * *